United States Patent [19]

Mozzi et al.

[11] Patent Number: 4,968,637
[45] Date of Patent: Nov. 6, 1990

[54] METHOD OF MANUFACTURE TIW ALIGNMENT MARK AND IMPLANT MASK

[75] Inventors: Robert L. Mozzi, Lincoln; Thomas E. Kazior, Sudbury, both of Mass.

[73] Assignee: Raytheon Company, Lexington, Mass.

[21] Appl. No.: 359,465

[22] Filed: May 31, 1989

[51] Int. Cl.⁵ ............... H01L 21/266; H01L 21/388
[52] U.S. Cl. ............................ 437/40; 437/30; 437/39; 437/245; 437/912; 437/924; 148/DIG. 105
[58] Field of Search ............. 437/924, 51, 22, 164, 437/30, 27, 28, 29, 39, 40, 41; 148/DIG. 105; 156/643

[56] References Cited

U.S. PATENT DOCUMENTS

| | | | |
|---|---|---|---|
| 4,098,917 | 7/1978 | Bullock et al. | 156/643 |
| 4,200,794 | 4/1980 | Newberry et al. | 437/164 |
| 4,330,343 | 5/1982 | Christou et al. | 437/22 |
| 4,442,590 | 4/1984 | Stockton et al. | 437/51 |
| 4,782,032 | 11/1988 | Geissberger et al. | 148/DIG. 105 |

FOREIGN PATENT DOCUMENTS

| | | | |
|---|---|---|---|
| 0116183 | 9/1979 | Japan | 437/924 |
| 0048455 | 12/1980 | Japan | 437/924 |
| 0141580 | 8/1983 | Japan | 437/924 |
| 0004019 | 1/1989 | Japan | 437/924 |

OTHER PUBLICATIONS

Wolf, S., et al., *Silicon Processing*, vol. 1, Lattice Press, 1986, pp. 439–441.

Primary Examiner—Brian E. Hearn
Assistant Examiner—T. N. Quach
Attorney, Agent, or Firm—Denis G. Maloney; Richard M. Sharkansky

[57] ABSTRACT

A method for defining simultaneously contact implants for source and drain regions and alignment markers for a gate electrode on a channel region includes the steps of providing a refractory metal layer of titanium tungsten over the substrate and patterning the refractory layer to form simultaneously an alignment marker and implant region mask over said substrate. Subsequent to an implant step, the refractory material in all regions of the substrate is removed, except for the portions defining the alignment markers, which are then used to align a masking pattern to provide component electrodes.

4 Claims, 1 Drawing Sheet

METHOD OF MANUFACTURE TIW ALIGNMENT MARK AND IMPLANT MASK

The Government has rights in this invention pursuant to Contract No. F33615-79-C-1923 awarded by Dept. of Air Force.

BACKGROUND OF THE INVENTION

This invention relates generally to semiconductor manufacturing techniques, more particularly to field effect transistor manufacturing techniques.

As is known in the art, metal electrode semiconductor field effect transistors are used in monolithic microwave integrated circuits. Such circuits are employed to amplify or switch high frequency r.f. signals. The more commonly used field effect transistor in microwave circuits is the MESFET (metal electrodes semiconductor field effect transistor). A typical MESFET includes a substrate typically of a III-V material such as gallium arsenide having disposed thereover an active layer which forms a channel region between source and drain contact layers. Disposed over the contact layers are source and drain electrodes disposed in low resistivity ohmic type contact to the contact layer. The active region generally has disposed thereover a gate electrode disposed in Schottky-barrier contact to the active region. Two principal techniques are known for providing the active layers and contact layers for a MESFET. In one technique, epitaxial layers of III-V materials such as gallium arsenide are grown in sequence over a gallium arsenide substrate. A more recent technique involves so-called ion implantation in which an ion specie is directed towards selected portions of the substrate and such ions are implanted into the surface of the substrate to provide a dopant species therein. Typically, during ion implantation, lattice damage of the crystal of gallium arsenide occurs. Such damage is repaired by subjecting the implanted substrate to an elevated temperature. This is commonly referred to as annealing.

The high concentration N+ contact layers used as contact layers in the MESFET for drain and source electrode are formed by ion implanting donor ions such as silicon or selenium. The separation between the gate and the N+ implant on the source side ($l_{SG}$) and between the gate and the N+ implant on the drain side ($l_{DG}$) have important influences on device characteristics particularly for high power FETS. Typical, desirable values for $l_{SG}$ are in the range of $0 < l_{SG} \leq 1$ μm and for $l_{DG}$, $0 < l_{DG} \leq 2$ μm depending upon the type of field effect transistor specifications, particularly whether the transistor will be used as a power device, switching device, a digital circuit device, or a low noise device.

Nevertheless, given a specified level of performance for the field effect transistor, accurate and precise placement of the gate electrode between the N+ implanted regions is sought. Several restrictions are imposed on registration schemes which are used during implant doping of gallium arsenide. In order that the implanted specie become electrically activated and thus properly dope the gallium arsenide crystal, the gallium arsenide crystal must be heated to the range of 800°-1000° C. to anneal implant induced radiation damage from the crystal and activate the dopant species. Most materials will react with or interdiffuse with gallium arsenide at these temperatures. Moreover, at these temperatures, the gallium arsenide surface will undergo dissociation (i.e. loss of arsenic). Thus, it is generally necessary to provide an implant anneal dielectric cap over the gallium arsenide substrate to prevent this loss. As a result of these limitations on processing, the implant and anneal steps are among the first steps performed in fabrication of field effect transistors. Following implant anneal, however, it is not possible to visually distinguish implanted regions from non-implanted regions or implanted regions having different dopant concentration. Therefore, there is no image to guide registration of subsequent alignment steps to the implanted and unimplanted regions of the substrate.

A straight forward registration procedure would be to form alignment marks on the wafer surface. Such alignment marks could take the form of a pattern etched into the gallium arsenide surface or into some film deposited on the surface. If such a film is used, they must be compatible with the high temperatures encountered during the annealing cycle. Moreover, subsequent layers such as the N+ implant and field effect transistor gate process must also be aligned to the same set of markers. In this case, however, the error in registration of a second layer to a first layer would be the combined error of registration of each layer to the markers. Higher accuracy is required for many applications of field effect transistors. Accordingly, a more accurate registration technique is required.

SUMMARY OF THE INVENTION

In accordance with the present invention, a method of aligning to an implanted region of a semiconductor such as when forming a field effect transistor includes the steps of depositing a thin layer of refractory material over a surface of the substrate. Preferably, a sacrificial layer of a dielectric such as $SiO_2$ is disposed over the substrate prior to deposition of the refractory material. This layer is used to protect the substrate during subsequent etch steps. The thin layer of refractory material is coated with a layer of resist, and the resist layer is patterned using a mask containing both N+ implant pattern and a border pattern used to define alignment markers. The refractory material is etched using the resist pattern as an etch mask. Preferably, a plasma or ion beam etch or other anisotropic etch is used. After the refractory material is etched, N-type dopant is implanted into the N+ dopant regions. The resist layer is removed, and a new resist layer is patterned to cover only alignment marks on the substrate. An etch is used to remove the refractory material from the surface of the substrate except in those regions where the alignment marks are disposed. With this particular arrangement, the markers may be used to subsequent align implants for the N layer of the field effect transistor, as well as, depositing of source and drain ohmic contact electrodes and the gate electrodes on the N layer. Since the N+ contact layers and the alignment markers are defined using a mask containing both patterns, the error in registration between the N+ regions and other features is reduced. Thus, high accuracy is obtained since the implanted pattern and the alignment markers are defined on a single photo mask, so that their position coordinates relative to one another are fixed on a single mask substrate rather than being positioned by alignment on each wafer from separate masks.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
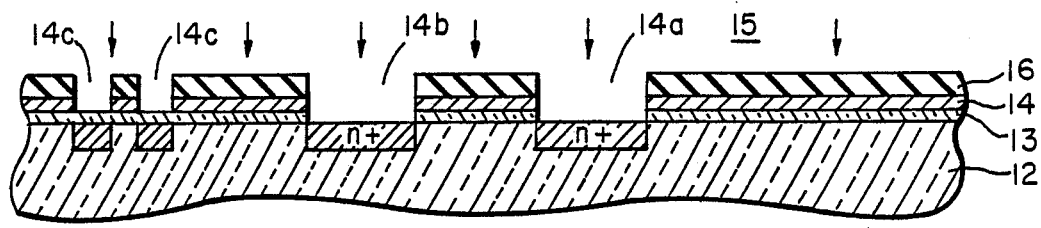
FIGS. 1-5 are a series of cross-sectional views showing stepson fabrication of the field effect transistor in accordance with the present invention.

Referring now to FIG. 1, a substrate 12 here comprised of semi-insulating gallium arsenide is shown to include disposed over a first surface thereof a sacrificial layer 13 comprised of a dielectric such as $SiO_2$, $Si_3N_4$ or other suitable material. This layer is used to protect the substrate from subsequent etching steps. The substrate further includes a layer 14 disposed over layer 13 and comprised of a refractory material, here said layer being an alloy comprised of titanium-tungsten which is deposited by sputtering from a titanium-tungsten target containing 10% titanium by weight. Other refractory materials in particular metals may alternatively be used for layer 14. Advantageously, the material 14 should be substantially inert during implantation and anneals as will be described such that the materials do not interdiffuse with the underlying gallium arsenide. As also shown in FIG. 1, the layer 14 has a patterned photoresist layer 16 disposed thereover. The photoresist layer 16 is patterned using conventional techniques and openings are made in the photoresist layers to expose underlying portions (not shown) of layer 14. Said underlying portions are etched away using conventional etching techniques such as preferably a reactive ion etching technique to provide substantially steep sidewalls in the titanium-tungsten layer 14, to faithfully replicate the resist pattern dimensions in the layer 14. The patterned layer 14 now includes the apertures 14a, 14b for N+ implants and apertures 14c for alignment mark 11. The sacrificial layer 13 is removed in regions 14a, 14b using a non-damaging etch to protect the underlying GaAs. A wet chemical etch is thus used. The substrate 12 is then disposed in an implantation apparatus (not shown), and ions 15 of here silicon or selenium atoms or other N-type dopants are implanted into portions of the substrate 12 underlying apertures 14a, 14b. Optionally, the implant could be done through sacrifical layer 13.

Figure 2:
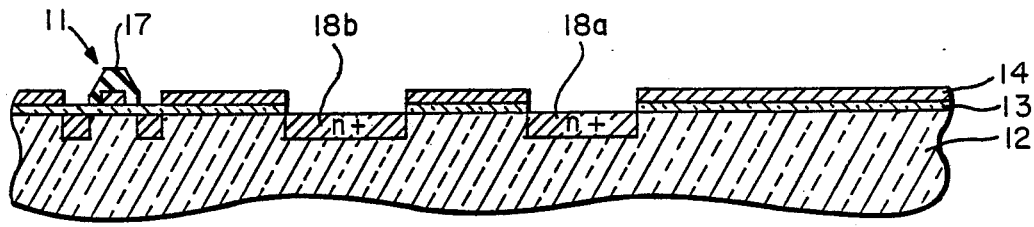

Referring now to FIG. 2, the implanted portions 18a and 18b here define N+ contact layers in the semiconductor substrate 12 which forms the contact layers for the field effect transistor. The layer 16 of resist is removed, and a second layer of resist (not shown) is disposed over layer 14. The resist is patterned to remove the resist in all areas except for patches 17 which cover underlying alignment marker 11. The underlying layer 14 is then etched away (FIG. 3) by exposing the Ti/W layer to an etch preferably a plasma etch comprised of a mix of 5% oxygen in Freon 14. The remainder of sacrificial layer 13 is also removed using a wet chemical etch as above.

Figure 3:
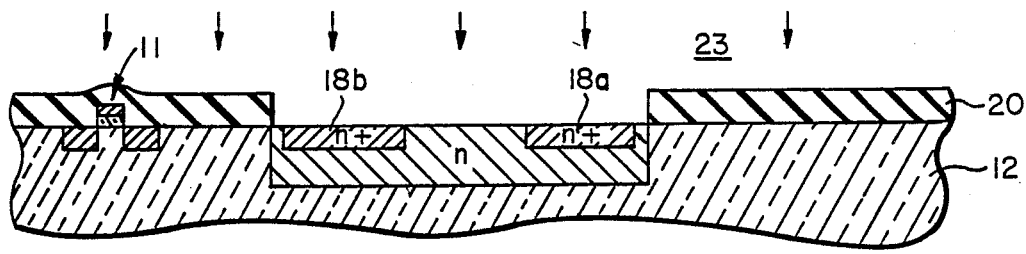

Referring now to FIG. 3, the titanium-tungsten layer 14 of FIG. 2 having been etched away as also the sacrificial layer 13, and the resist layer 17 having also been removed using conventional techniques, a third resist layer 20 is disposed over the substrate and is patterned to exposed active areas of the field effect transistor. Here, alignment marker 11 is used to provide a registration mark for alignment with mask layers to the substrate 12 to perform this relatively non-critical alignment step. Typically, this alignment technique can be within ±1 micron which can be done by routine methods well known to a person of skill in the art. After resist layer 20 is patterned to expose active regions of the device, the substrate 12 is again subjected to N type ions 23 to provide the N region 19 as shown. Here said N region 19 has a desired doping density in the range of about $1 \times 10^{16}$ to $1 \times 10^{18}$ atoms/cc, whereas the N+ doped regions 18a and 18b have dopant concentrations in excess of about $10^{18}$ atoms/cc. Again, silicon and/or selenium are used as a dopant species.

After the second implant, each one of the implanted regions 18a, 18b, and 19 are activated by annealing the substrate 12 using conventional techniques. For example, a dielectric (not shown) may be disposed over the surface 12 to prevent dissociation from the surface during the annealing step. Typically, the annealing is accomplished by subjecting the substrate 12 to an elevated temperature in the range of about 800° C.-1000° C. for a predetermined period of time.

Here the alignment mark 11 is a square, $20\mu$ per side located in a region of the substrate through which the substrate is cut into individual circuits. There would be one alignment marker fabricated for each individual reticle or unique region of the substrate 10.

Figure 4:
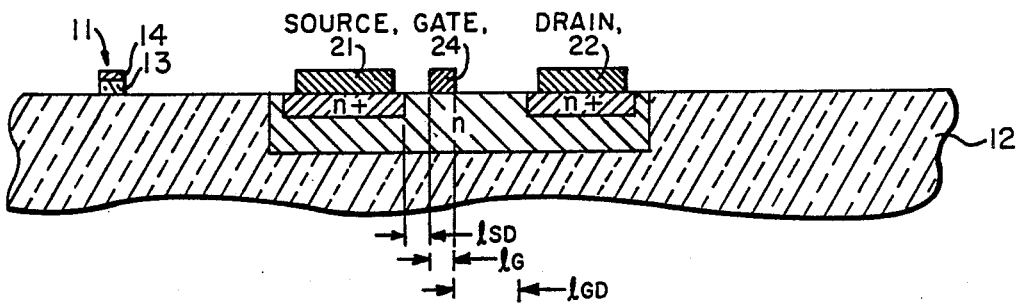

Referring now to FIG. 4, drain electrode 22, source electrode 21, and gate electrode 24 are disposed over respective source, drain, and gate regions as shown using conventional techniques. For example, the source and drain contacts are provided by evaporating metal through and over a patterned resist and lifting off the patterned resist as is commonly known to leave behind source and drain electrodes in contact with the underlying N+ layers 18a and 18b as shown. The source and drain electrodes are alloyed with the N+ regions to provide low ohmic contact resistance as is well known in the art. The electrode regions 21 and 22 are made sufficiently smaller than their underlying N+ regions 18a and 18b such that small misalignments at this juncture will not place the source or drain electrodes beyond the N+ regions. Thus, the registration step required from this technique is also relatively non-critical. Alignment mark 11 is used as a registration mark during the patterning of the source, drain metalization layer (not numbered) to form source and drain electrodes 21 and 22 as shown. Gate electrode 24 having a length $l_G$ is disposed on channel region 19 using conventional gate processing techniques such as electron beam gate writing or photolithography. The alignment marks 11 are used to maintain registration accuracy $l_{SG}$ and $l_{DG}$ to within about ±0.2 microns or better. Although this is a relatively critical alignment step, such alignment is well within the capability of modern optical or electron beam systems.

The above described alignment requires close line width control of the N+ implant patterning within approximately 0.1 microns and relatively accurate gate to N+ implant registration (within approximately ±0.2 microns). Each of these requirements are within existing capabilities of electron beam writing and optical lithographic systems. For example, sample distortion due to thermal expansion or wafer bowing during patterning are automatically compensated for in modern direct write e-beam pattern generators which do chip by chip alignments.

Among the advantages of this process are the flexibility allowed in sequencing processing steps. The N implant could be a blanket N implant over the entire surface done either before or after the N+ implant. If this is used rather than the pocket implant described above, carrier compensation in active areas could be achieved by mesa etching or implant radiation damage. Although the alignment markers have been described as refractory patterned metal layers, such alignment markers could alternatively be features etched into the gallium arsenide defined from a resist mask which forms simultaneously with the etch mask for the N+ implant. This would result in recessed N+ regions which may be acceptable.

Figure 5:
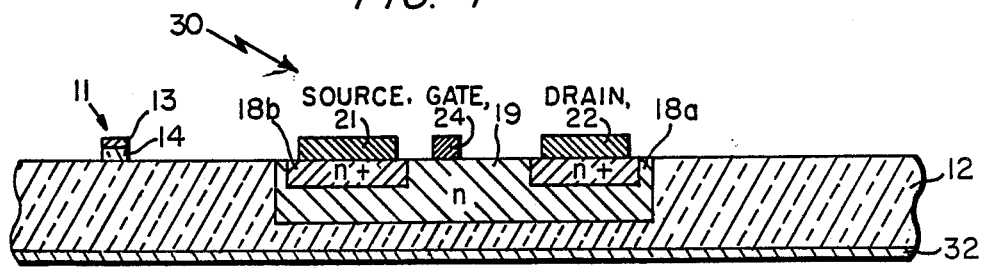

Referring now to FIG. 5, the field effect transistor 30 is shown over substrate 12 which has been thinned to a thickness of typically 4 mils. Over an opposite surface of the substrate is provided a ground plane conductor 32 as is generally known in the prior art.

The material used to provide the marker 11 must satisfy several requirements. For example, the material must be capable of surviving the high temperature implant anneal step. It also should not react or interdiffuse with the gallium arsenide. Refractory materials such as refractory metals or dielectrics are thus preferred.

Moreover, the material of the marker 11 must provide a distinguishable pattern to the alignment system which uses the marker for layer to layer registration. For example, in an electron beam system used to write or pattern gate electrodes a common method of marker detection is to use the contrast in backscattered electron intensity between the material of the marker and the material surrounding the marker (i.e. gallium arsenide) to distinguish the marker. In this situation, a refractory material containing a much higher atomic number material than gallium or arsenic (for example, tungsten) is used. The contrast is thus provided by the high backscattered intensity associated with the high atomic number material compared to the intensity provided by the gallium or the arsenic.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A method of forming a semiconductor device comprising the steps of: providing a refractory material of an alloy of tungsten-titanium over a first surface of a substrate;
    patterning said refractory material to simultaneously form an annulus region free of said refractory material about an alignment marker of said refractory material on said substrate and an implant mask over said substrate;
    implanting ions through said implant mask to substrate regions after patterning said refractory material and prior to removal of said refractory material; and
    removing the refractory material in all regions of said substrate except for the portion of said layer defining the alignment marker.

2. The method of claim 1 further comprising the step of providing a feature on said substrate aligned to said implant regions using said alignment mark to locate said implant regions.

3. A method of forming a field effect transistor comprising the steps of:
    providing a refractory material of tungsten-titanium over a first surface of the substrate; and
    patterning said refractory material to simultaneously form an alignment marker of said refractory material on said substrate, and an N+ implant mask over said substrate;
    removing the refractory material in all regions of said substrate except for the portion of said layer defining the alignment marker;
    providing an N+ implant through said N+ implant mask prior to removal of said refractory material to provide contact regions; and
    providing an N implant after removal of said refractory material to define an N type channel between said contact regions.

4. The method of claim 3 further comprising the step of providing source, drain, and gate electrodes over respective contact regions and channel region while using said alignment marker to align a masking pattern used to provide said source, drain, and gate electrodes.

* * * * *